(12) United States Patent
Yue et al.

(10) Patent No.: US 12,074,593 B1
(45) Date of Patent: Aug. 27, 2024

(54) HIGH-VOLTAGE TOLERANT MULTIPLEXER

(71) Applicant: Synopsys, Inc., Sunnyvale, CA (US)

(72) Inventors: Stephen Yue, Richmond Hill (CA); Raymond Tam, Richmond Hill (CA)

(73) Assignee: Synopsys, Inc., Sunnyvale, CA (US)

(*) Notice: Subject to any disclaimer, the term of this patent is extended or adjusted under 35 U.S.C. 154(b) by 0 days.

(21) Appl. No.: 17/977,803

(22) Filed: Oct. 31, 2022

Related U.S. Application Data

(60) Provisional application No. 63/273,996, filed on Oct. 31, 2021.

(51) Int. Cl.
*H03K 17/62* (2006.01)
*G06F 30/31* (2020.01)
*H03K 17/10* (2006.01)
*H03K 17/687* (2006.01)
*H03K 17/693* (2006.01)

(52) U.S. Cl.
CPC ........... *H03K 17/102* (2013.01); *G06F 30/31* (2020.01)

(58) Field of Classification Search
None
See application file for complete search history.

(56) References Cited

U.S. PATENT DOCUMENTS

| | | | | |
|---|---|---|---|---|
| 6,137,340 A | * | 10/2000 | Goodell | H03K 17/6257 327/403 |
| 6,239,646 B1 | * | 5/2001 | Navabi | H03K 17/6264 327/407 |
| 6,310,509 B1 | * | 10/2001 | Davenport | H04J 3/047 327/407 |
| 6,760,349 B1 | * | 7/2004 | Ho | H03K 17/6264 370/537 |
| 7,088,170 B2 | * | 8/2006 | Morf | G11C 7/1012 327/407 |
| 7,123,074 B2 | * | 10/2006 | Neumann | H04J 3/047 327/407 |
| 7,816,972 B2 | * | 10/2010 | Yang | H04J 3/047 327/407 |
| 9,350,343 B2 | * | 5/2016 | Kase | H03K 17/693 |
| 10,069,489 B2 | * | 9/2018 | Zhang | H03K 5/00006 |
| 10,263,605 B2 | * | 4/2019 | Zhang | H03L 7/18 |
| 10,425,051 B2 | * | 9/2019 | Nagatani | H03K 17/62 |

* cited by examiner

*Primary Examiner* — Kenneth B Wells
(74) *Attorney, Agent, or Firm* — Weaver Austin Villeneuve & Sampson LLP

(57) ABSTRACT

A differential multiplexer includes a number of input stages. Each stage includes, in part, first and second transistor receiving an input signal and the inverse of the input signal, a biasing circuit supplying a bias to the gate terminal of the first and second transistors, a current source coupled between a source terminal of the first and second transistors and a ground terminal, a first switch coupling a drain terminal of the first transistor to a first terminal of a first resistor having a second terminal coupled to a supply voltage, a second switch coupling a drain terminal of the second transistor to a first terminal of a second resistor having second terminal coupled to the supply voltage, a third switch coupling the drain terminal of the first transistor to the supply voltage, and a fourth switch coupling the drain terminal of the second transistor to the supply voltage.

20 Claims, 4 Drawing Sheets

HIGH-VOLTAGE TOLERANT MULTIPLEXER

RELATED APPLICATION

The present application claims benefit under 35 USC 119(e) of U.S. Patent Application No. 63/273,996, filed Oct. 31, 2021, the content of which is incorporated herein by reference in its entirety.

TECHNICAL FIELD

The present application relates to integrated circuits, and more particularly to a differential multiplexer.

BACKGROUND

In high-speed communication protocols, such as the PCI-Express, the amplitude of the reference clock signal may become greater than the junction breakdown voltage of the transistors, thereby causing the transistors to degrade due to such factors as gate oxide breakdown, and process parameter shifts. The junction voltages of the transistors of a multiplexer disposed in such high-speed communication interface circuits, therefore, should not exceed the breakdown voltages, regardless of the amplitude of the received reference clock signal.

SUMMARY

A differential multiplexer, in accordance with one embodiment of the present disclosure, includes, in part, at least first and second input stages. Each input stage includes, in part, a first transistor receiving an input signal; a second transistor receiving an inverse of the input signal; a biasing circuit adapted to bias a gate terminal of each of the first and second transistors; a first capacitor coupled between the biasing circuit and the gate terminal of the first transistor; a second capacitor coupled between the biasing circuit and the gate terminal of the second transistor; a first current source coupled between a source terminal of each of the first and second transistors and a ground terminal; a first switch adapted to couple a drain terminal of the first transistor to a first terminal of a first resistor in response to a select signal, wherein a second terminal of the first resistor is coupled to a supply voltage; a second switch adapted to couple a drain terminal of the second transistor to a first terminal of a second resistor in response to the select signal, wherein a second terminal of the second resistor is coupled to the supply voltage; a third switch adapted to couple the drain terminal of the first transistor to the supply voltage in response to an inverse of the select signal; and a fourth switch adapted to couple the drain terminal of the second transistor to the supply voltage in response to the inverse of the select signal.

In one embodiment, the biasing circuit includes, in part, a bandgap circuit. In one embodiment, the biasing circuit further includes, in part, a third resistor coupled between the gate terminal of the first transistor and a first node; and a fourth resistor coupled between the gate terminal of the second transistor and the first node. In one embodiment, the biasing circuit biases the gate terminals of the first and second transistors at nearly one half of a voltage swing of the input signal.

In one embodiment, the first current source is adapted to maintain the first and second transistors in weak conductive states when the third and fourth switches are closed. In one embodiment, the differential multiplexer further includes, in part, a common current source. In such embodiments, each input stage further includes, in part, a fifth switch adapted to couple the first and second transistors disposed in the stage to the common current source in response to the select signal. In one embodiment, each of the first and second transistors of each stage is an n-channel MOS transistor. In one embodiment, each of the first and second resistors has a first resistance, and each of the third and fourth resistors has a second resistance that is greater than the first resistance.

A system, in accordance with one embodiment of the present disclosure, includes, in part, a memory storing instructions, and a processor, coupled with the memory and to execute the instructions. The instructions when executed cause the processor to generate data representative of a differential multiplexer that includes at least first and second input stages. Each input stage includes, in part, a first transistor receiving an input signal; a second transistor receiving an inverse of the input signal; a biasing circuit adapted to bias a gate terminal of each of the first and second transistors; a first capacitor coupled between the biasing circuit and the gate terminal of the first transistor; a second capacitor coupled between the biasing circuit and the gate terminal of the second transistor; a first current source coupled between a source terminal of each of the first and second transistors and a ground terminal; a first switch adapted to couple a drain terminal of the first transistor to a first terminal of a first resistor in response to a select signal, wherein a second terminal of the first resistor is coupled to a supply voltage; a second switch adapted to couple a drain terminal of the second transistor to a first terminal of a second resistor in response to the select signal, wherein a second terminal of the second resistor is coupled to the supply voltage; a third switch adapted to couple the drain terminal of the first transistor to the supply voltage in response to an inverse of the select signal; and a fourth switch adapted to couple the drain terminal of the second transistor to the supply voltage in response to the inverse of the select signal.

In one embodiment, the biasing circuit comprises a bandgap circuit. In one embodiment, the biasing circuit further includes, in part, a third resistor coupled between the gate terminal of the first transistor and a first node; and a fourth resistor coupled between the gate terminal of the second transistor and the first node. In one embodiment, the biasing circuit biases the gate terminals of the first and second transistors at nearly one half of a voltage swing of the input signal.

In one embodiment, the first current source is adapted to maintain the first and second transistors in weak conductive states when the third and fourth switches are closed. In one embodiment, the differential multiplexer further includes, in part, a common current source, wherein each input stage further includes, in part, a fifth switch adapted to couple the first and second transistor disposed in the stage to the common current source in response to the select signal. In one embodiment, each of the first and second transistors of each stage is an n-channel MOS transistor. In one embodiment, each of the first and second resistors has a first resistance, and each of third and fourth resistors has a second resistance that is greater than the first resistance.

A non-transitory computer readable medium includes stored instructions, which when executed by a processor, cause the processor to generate data representative of a differential multiplexer. The differential multiplexer includes, in part, a first transistor receiving an input signal;

a second transistor receiving an inverse of the input signal; a biasing circuit adapted to bias a gate terminal of each of the first and second transistors; a first capacitor coupled between the biasing circuit and the gate terminal of the first transistor; a second capacitor coupled between the biasing circuit and the gate terminal of the second transistor; a first current source coupled between a source terminal of each of the first and second transistors and a ground terminal; a first switch adapted to couple a drain terminal of the first transistor to a first terminal of a first resistor in response to a select signal, wherein a second terminal of the first resistor is coupled to a supply voltage; a second switch adapted to couple a drain terminal of the second transistor to a first terminal of a second resistor in response to the select signal, wherein a second terminal of the second resistor is coupled to the supply voltage; a third switch adapted to couple the drain terminal of the first transistor to the supply voltage in response to an inverse of the select signal; and a fourth switch adapted to couple the drain terminal of the second transistor to the supply voltage in response to the inverse of the select signal.

In one embodiment, the biasing circuit further includes, in part, a bandgap circuit. In one embodiment, the biasing circuit further includes, in part, a third resistor coupled between the gate terminal of the first transistor and a first node; and a fourth resistor coupled between the gate terminal of the second transistor and the first node. In one embodiment, the biasing circuit biases the gate terminals of the first and second transistors at nearly one half of a voltage swing of the input signal.

DETAILED DESCRIPTION

A multiplexer circuit fabricated using a CMOS technology should be able to operate at supply voltages that may be smaller than the voltages of the input signals received by the multiplexer circuit. For example, the maximum single-ended peak-to-peak swing of a PCI-Express reference clock signal received by a multiplexer circuit is 1.45 volts. Such a voltage should not exceed the maximum junction voltage of the transistors fabricated using a silicon manufacturing process that limits the supply voltage to a value ranging, for example, from 1.2 volts to 1.32 volts.

Embodiments of the present disclosure overcome the aforementioned challenges by maintaining the junction voltages of the transistors below their respective breakdown voltages, thereby enhancing the voltage tolerance of the multiplexer circuit. To achieve this, a multiplexer circuit, in accordance with embodiments of the present disclosure, in part, maintains the input transistors disposed in the multiplexer in relatively weak conductive states (e.g., subthreshold states) so as to prevent high voltages from being applied to the transistors' junctions. Moreover, embodiments of the present disclosure ensure that the transistor junction breakdown voltages meet the voltage limits through DC biasing of the differential input stages of the multiplexer. Among technical advantages of the present disclosure is a multiplexer circuit having PMOS and NMOS transistors that are not subject to junction voltages exceeding their respective breakdown voltages, and which has an enhanced immunity to noise due to the differential signal processing capability of the multiplexer.

Figure 1:
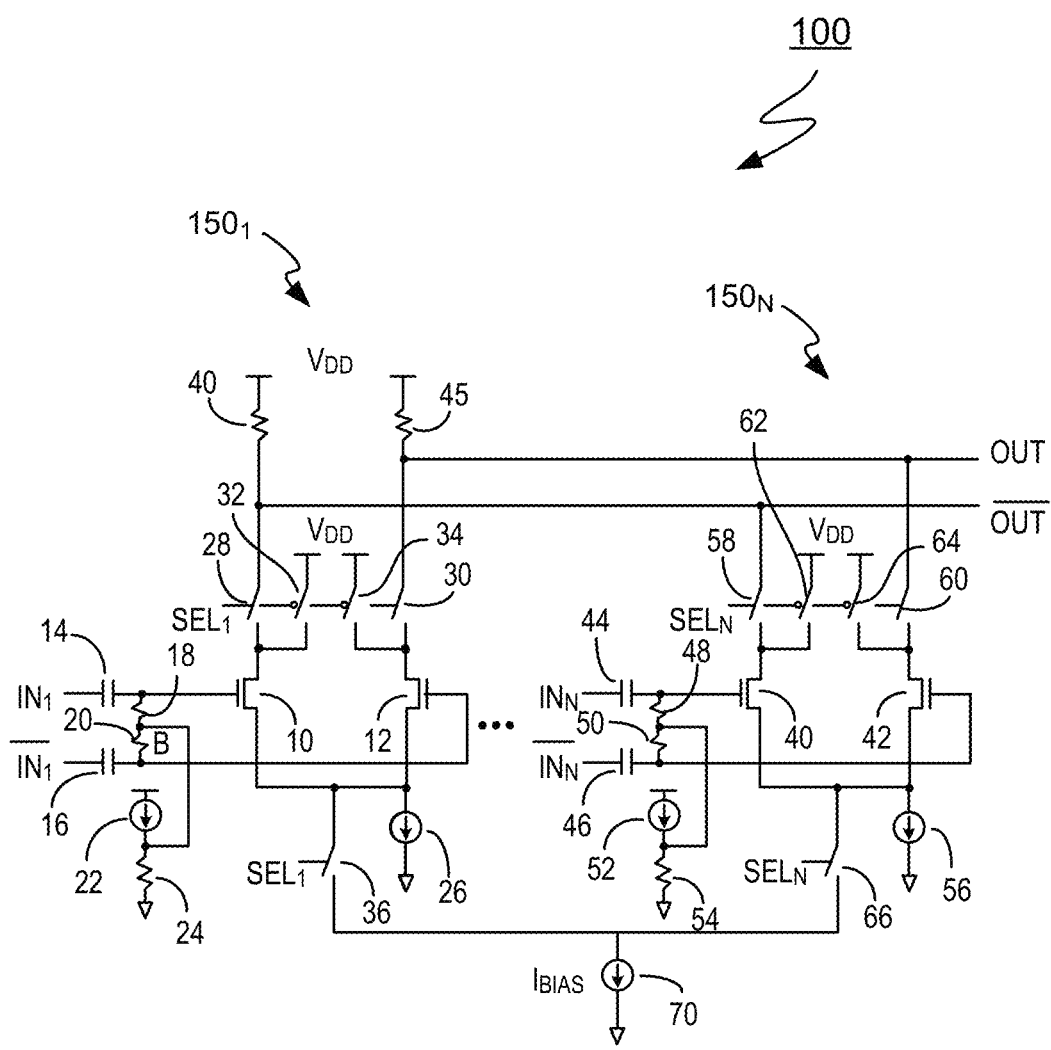
FIG. 1 is a schematic diagram of a differential multiplexer, in accordance with one embodiment of the present disclosure.

FIG. 1 is a transistor schematic diagram of a multi-stage differential multiplexer 100, in accordance with one embodiment of the present disclosure. Multiplexer 100 includes N differential input stages $150_1$, $150_2$ ... $150_N$, where N is an integer greater than or equal to two. Only two of the differential input stages, namely $150_1$ and $150_N$ of multiplexer 100 are shown in FIG. 1. At any given time, only one of the N input stages of the multiplexer 100 is selected. Accordingly, when, for example, signal $SEL_1$ is asserted to select stage $150_1$, signals $SEL_2$, $SEL_3$ ... $Sel_N$ are unasserted so as not to select stages $150_2$, $150_3$ ... $150_N$.

Input stage $150_1$ is shown as including NMOS transistors 10, 12, switches 28, 30, 32, 34, 36, capacitors 14, 16, resistors 18, 20, 24, and current source 22 and 26. Similarly, input stage $150_N$ is shown as including NMOS transistors 40, 42, switches 58, 60, 62, 64, 66, capacitors 44, 46, resistors 48, 50, 54, and current sources 52 and 56. Resistors 40, 45 and current source 70 are common to all input stages of the multiplexer. When, for example, signal $SEL_1$ is asserted to select stage $150_1$, output signals OUT and $\overline{OUT}$ are received from the drain terminals of transistors 10 and 12. Similarly, when, for example, signal $SEL_N$ is asserted to select stage $150_N$, output signals OUT and $\overline{OUT}$ are received from the drain terminals of transistors 40 and 42. The following description is provided with reference to stage $150_1$. It is understood, however, that the other stages of the multiplexer are identical to and operate in the same manner as stage $150_1$.

Current source 22 together with resistors 18, 20, and 24 form a biasing circuit adapted to maintain the voltages at the gate terminals of input transistors 10 and 12 at nearly half the differential voltage swing applied to terminals $IN_1$ and $\overline{IN}_1$. To achieve this, current source 22 generates a current defined by a reference voltage $V_{REF}$, which in turn, is generated by a reference voltage generator, such as a bandgap circuit described further below with reference to FIG. 2. The voltage at node B is therefore defined by ( $$\frac{R_{24}}{R_{REF}} * V_{REF}$$

), where $R_{24}$ is the resistance of resistor 24 and $R_{REF}$ is the resistance used in the bandgap circuit to generate the reference voltage $V_{REF}$.

The voltage at node B and the resistances of resistors 18, 20 and 24 are selected so as to maintain the voltages at the gate terminals of transistors 10 and 12 at nearly half the differential voltage swing applied to terminals $IN_1$ and $\overline{IN}_1$. For example, for the PCI-Express, when the differential voltage swing applied to input terminals $IN_1$ and $\overline{IN}_1$ is 1.45 volts, the biasing circuit maintains the DC bias at the gate terminals of transistors 10 and 12 at nearly 0.725 volts.

Capacitors 14, 16 are AC coupling capacitors and together with resistors 18, 20 ensure, in part, that the gate voltages of transistors 10 and 12 are not pulled below the ground potential. For example, when $IN_1$ and $\overline{IN}_1$ receive 1.15 and −0.30 volts respectively (thus maintaining a voltage swing of 1.45 volts) the voltage at the gate terminal of transistor 12 remains above the ground potential.

When signal $SEL_1$ is asserted to select stage $150_1$, switches 28, 30 and 36 are closed, thereby providing a current path from supply voltage $V_{DD}$ to the ground terminal, and thus enabling output signals OUT and $\overline{OUT}$ to reach their respective differential voltages. Transistors 10 and 12 of the selected stage $150_1$ are inhibited from receiving voltages exceeding their junction breakdown voltages.

Current sources 26 and 56 generate relatively small amounts of current in stages $150_1$ and $150_N$, respectively. For example, when current $I_{bias}$, which flows through current source 70 and which is common to all stages of the multiplexer, supplies a current of 300 uA, each of current sources 26 and 56 may supply a relatively smaller current of 5 μA.

For an unselected stage, such as stage 150N in this example, signal SELN is unasserted, thereby causing switches 58 and 60 to be open, and switches 62 and 64, that receive the inverse (complement) of signal SELN, to be closed. Therefore, a conductive path is formed from the supply voltage VDD through switches 62, 64 and transistors 40 and 42 to the ground terminal through current source 56. Transistor 42 is in an off state. The small amount of current drawn by current source 56 causes transistor 40 to be in a relatively weak on (conductive) state with a drain-to-source channel formed and maintained at the same voltage level as the drain and source voltage, which is the same as the supply voltage VDD. The presence of the channel protects the gate oxide from exposure to the full gate-to-bulk voltage which may be, for example, 1.45V for transistor 40, and reduces the gate-to-channel voltage to a value below the breakdown voltage. Because one of the input stage transistors of an unselected stage, such as transistors 40 in this example, is in a weak conductive state, transistor 40 includes a channel, which in turn, reduces the voltage across the gate-to-source, gate-to-drain and gate-to-channel regions of transistor 40.

In accordance with one example, the maximum allowable gate-to-source (Vgs) and gate-to-drain (Vgd) voltage may be 1.32 volts for the transistors disposed in multiplexer 100. In such an example, the supply voltage $V_{DD}$ may be set to 0.9 volts, capacitors 14 and 16 may have a capacitance of 1 picofarad (pF), resistors 18 and 20 may have a resistance of 450 kilo-ohms (kΩ), resistors 40 and 45 may have a resistance of 1 kΩ, the voltage supplied by the bandgap circuitry may be 0.45 volts, the resistance of resistor 24 may be 29 kΩ, current source 70 may be set to 300 micro-amps (μA), and current source 26 may be set to 5 μA.

Assuming that signal $SEL_1$ is asserted to select stage $150_1$ and, further, that the voltages at the gate terminals of transistors 10 and 12 are respectively at 1.45 volts and 0 volts, given the above examples of the resistance, capacitance and current values, the voltage at the common source of transistors 10 and 12 is at 0.55 volts. Because, according to this example, the gate voltage of transistor 12 is at 0 volt, transistor 12 is off thus causing its drain voltage to be at 0.9 volts. Therefore, the gate-to-source and gate-to-drain voltages of transistor 12 are at −0.55 volts and −0.9 volts, respectively. Accordingly, the gate-to-source and gate-to-drain voltages of transistor 12 are smaller than the breakdown voltage of 1.32 volts.

Because transistor 10 is on according to this example, its drain voltage is at 0.6 volts. Therefore, the gate-to-source and gate-to-drain voltages of transistor 10 are at 0.9 and 0.85 volts, respectively. Accordingly, the gate-to-source and gate-to-drain voltages of transistor 10 are also smaller than the breakdown voltage of 1.32 volts.

For an unselected stage, such as stage $150_N$, switches 58, 60 and 66 are open and switches 62 and 64 are closed. Therefore, the drain terminals and the common source terminals of transistors 40 and 42 are at the $V_{DD}$ supply voltage of 0.9 volts. If the gate voltages of transistors 40 and 42 are at 1.45 volts and 0 volts respectively, the gate-to-source, gate-to-drain and gate-to-channel voltages of transistor 40 are at 0.55 volts, and the gate-to-source and gate-to-drain voltages of transistor 42 are at −0.9 volts. Accordingly, the gate-to-source, gate-to-drain and gate-to-channel voltages of both transistors 40 and 42 of the unselected stage $150_N$ are also smaller than the breakdown voltage of 1.32 volts. The above example shows that the input stage transistors, such as transistors 10, 12, 40 and 42, may be selected to be core transistors which have a smaller breakdown voltage than the high voltage transistors used in the periphery or input/output (I/O) of an integrated circuit. Such core transistors may be used as input stage transistors 10, 12, 40, 42, if the gate-to-source, gate-to-drain and gate-to-channel voltages of such core transistors do not exceed 0.9 volts.

As was described above, in accordance with embodiments of the present disclosure, by passing a small amount of current through all input stages of the multiplexer, using for example, current sources 26 and 56 of stages $150_1$ and $150_N$ respectively, one of the input transistors of each unselected stage (e.g., transistor 40 of differential input stage $150_N$), is maintained in a weak conductive state. Therefore, the gate-to-source, gate-to-drain and gate-to-channel voltages of the transistors in an unselected stage are also maintained below their respective breakdown voltages, thereby avoiding the reliability issues that would otherwise stress the gate oxide of the transistors.

As was also described above, in accordance with embodiments of the present disclosure, the DC biasing of the input transistors together with the AC coupling capacitors and the bandgap circuitry cause the gate voltages of the input transistors to be nearly at half of the single-ended peak-to-peak swing of the input signal, thereby maximizing the allowable input voltage swing for a given technology-dependent voltage range.

Figure 2:
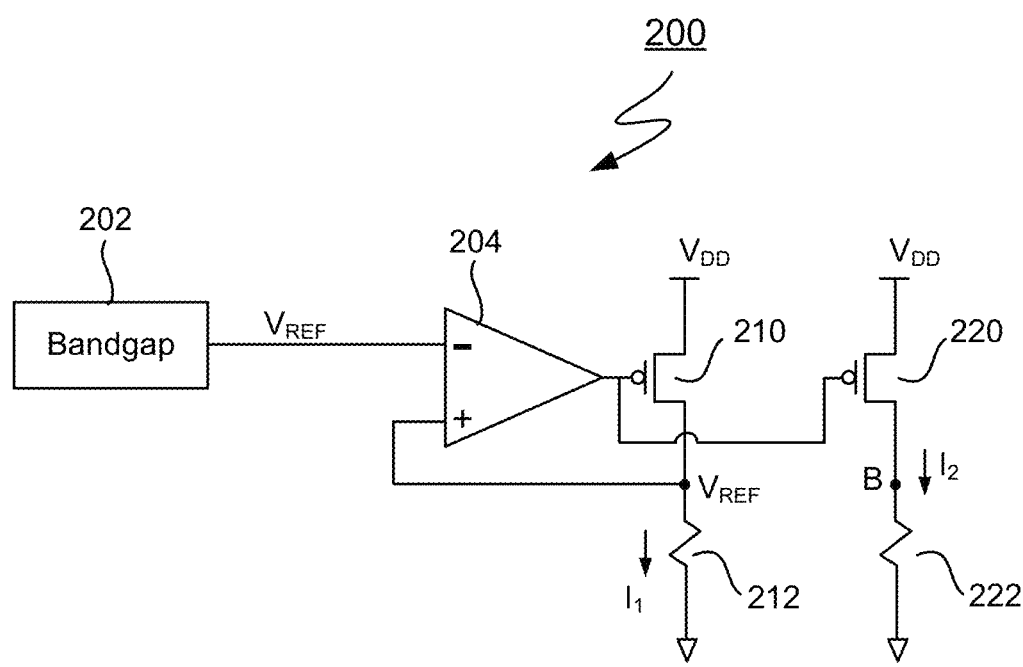
FIG. 2 is a schematic diagram of a reference voltage generator circuit used in the differential multiplexer of FIG. 1, in accordance with one embodiment of the present disclosure.

FIG. 2 is a schematic diagram of a circuit adapted to generate the reference voltage $V_{REF}$ described above. The reference voltage $V_{REF}$ generated by bandgap circuit 202 is applied to the negative input terminal of amplification stage 204. The output terminal of amplification stage 204 is coupled to the gate terminal of PMOS transistor 210, and the positive input terminal of amplification stage 204 is coupled to the drain terminal of PMOS transistor 210. Consequently, the voltage at the drain terminal of transistor 210 is substantially equal to and tracks voltage $V_{REF}$. The output terminal of amplification stage 204 is also coupled to the gate terminal of PMOS transistor 220. Because transistors 210 and 220 have the same gate-to-source voltages, current $I_1$ flowing through transistor 210 and resistor 212 is mirrored as current $I_2$ flowing in transistor 220 and resistor 222. In other words, currents $I_1$ and $I_2$ have substantially the same value. Resistor 222 of circuit 200 represents resistors 24 and/or 54 shown in FIG. 1. The drain terminal of transistor 220 represents node B of FIG. 1.

Figure 3:
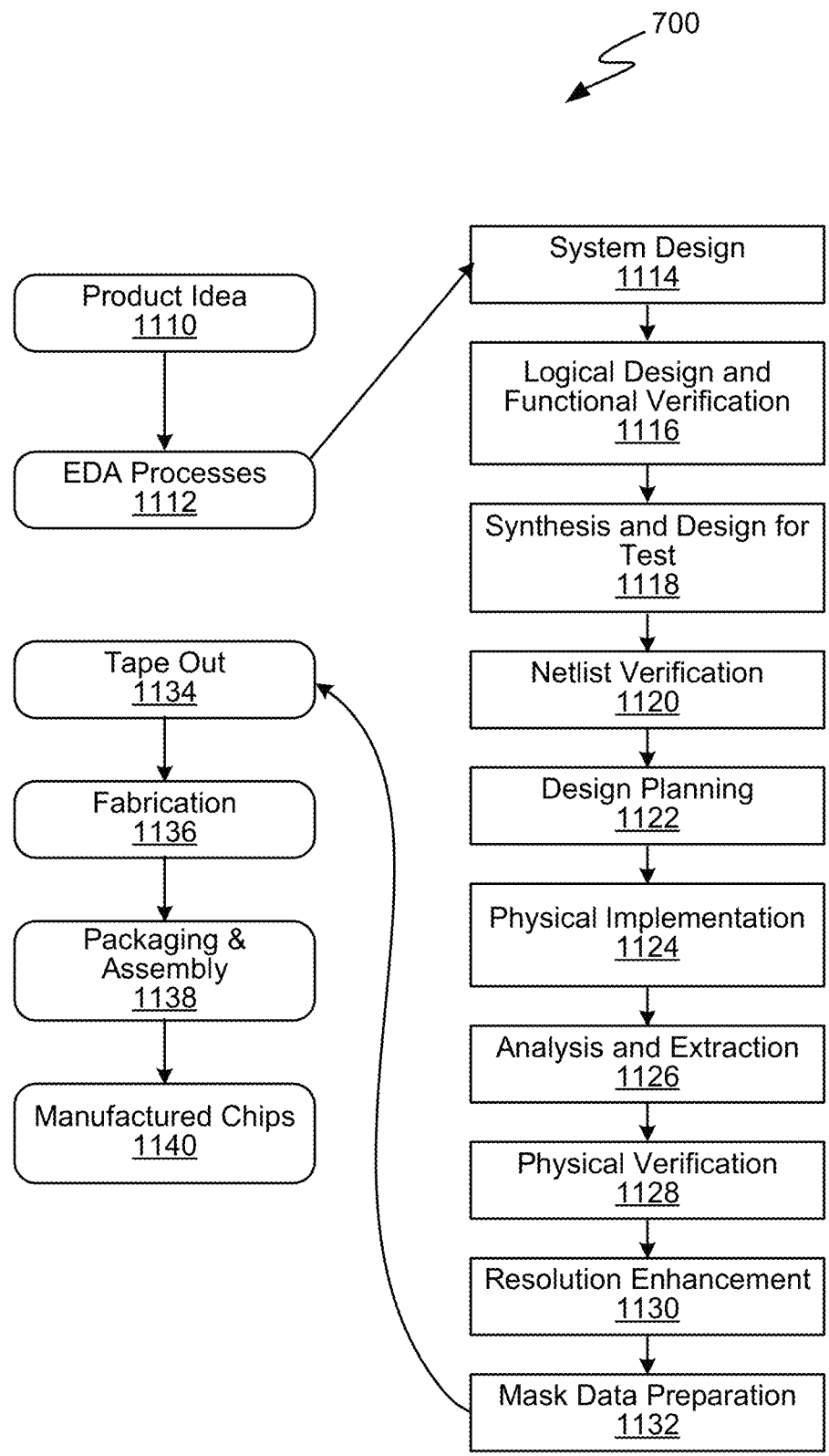
FIG. 3 depicts a flowchart of various processes used during the design and manufacture of an integrated circuit in accordance with some embodiments of the present disclosure.

FIG. 3 illustrates an example set of processes 700 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 710 with information supplied by a designer, information which is transformed to create an article of manufacture that uses a set of EDA processes 712. When the design is finalized, the design is taped-out 734, which is when artwork (e.g., geometric patterns) for the integrated circuit is sent to a fabrication facility to manufacture the mask set, which is then used to manufacture the integrated circuit. After tape-out, a semiconductor die is fabricated 736 and packaging and assembly processes 738 are performed to produce the finished integrated circuit 740.

Specifications for a circuit or electronic structure may range from low-level transistor material layouts to high-level description languages. A high-level of abstraction may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower abstraction level that is a less abstract description adds more useful detail into the design description, for example, more details for the modules that include the description. The lower levels of abstraction that are less abstract descriptions can be generated by a computer, derived from a design library, or created by another design automation process. An example of a specification language at a lower level of abstraction language for specifying more detailed descriptions is SPICE, which is used for detailed descriptions of circuits with many analog components. Descriptions at each level of abstraction are enabled for use by the corresponding tools of that layer (e.g., a formal verification tool). A design process may use a sequence depicted in FIG. 2. The processes described are enabled by EDA products (or tools).

During system design 714, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 716, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 718, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 720, the netlist is checked for compliance with timing constraints and for correspondence with the HDL code. During design planning 722, an overall floor plan for the integrated circuit is constructed and analyzed for timing and top-level routing.

During layout or physical implementation 724, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 726, the circuit function is verified at the layout level, which permits refinement of the layout design. During physical verification 728, the layout design is checked to ensure that manufacturing constraints are correct, such as DRC constraints, electrical constraints, lithographic constraints, and that circuitry function matches the HDL design specification. During resolution enhancement 730, the geometry of the layout is transformed to improve how the circuit design is manufactured.

During tape-out, data is created to be used (after lithographic enhancements are applied if appropriate) for production of lithography masks. During mask data preparation 732, the 'tape-out' data is used to produce lithography masks that are used to produce finished integrated circuits.

A storage subsystem of a computer system (such as computer system 900 of FIG. 4) may be used to store the programs and data structures that are used by some or all of the EDA products described herein, and products used for development of cells for the library and for physical and logical design that use the library.

Figure 4:
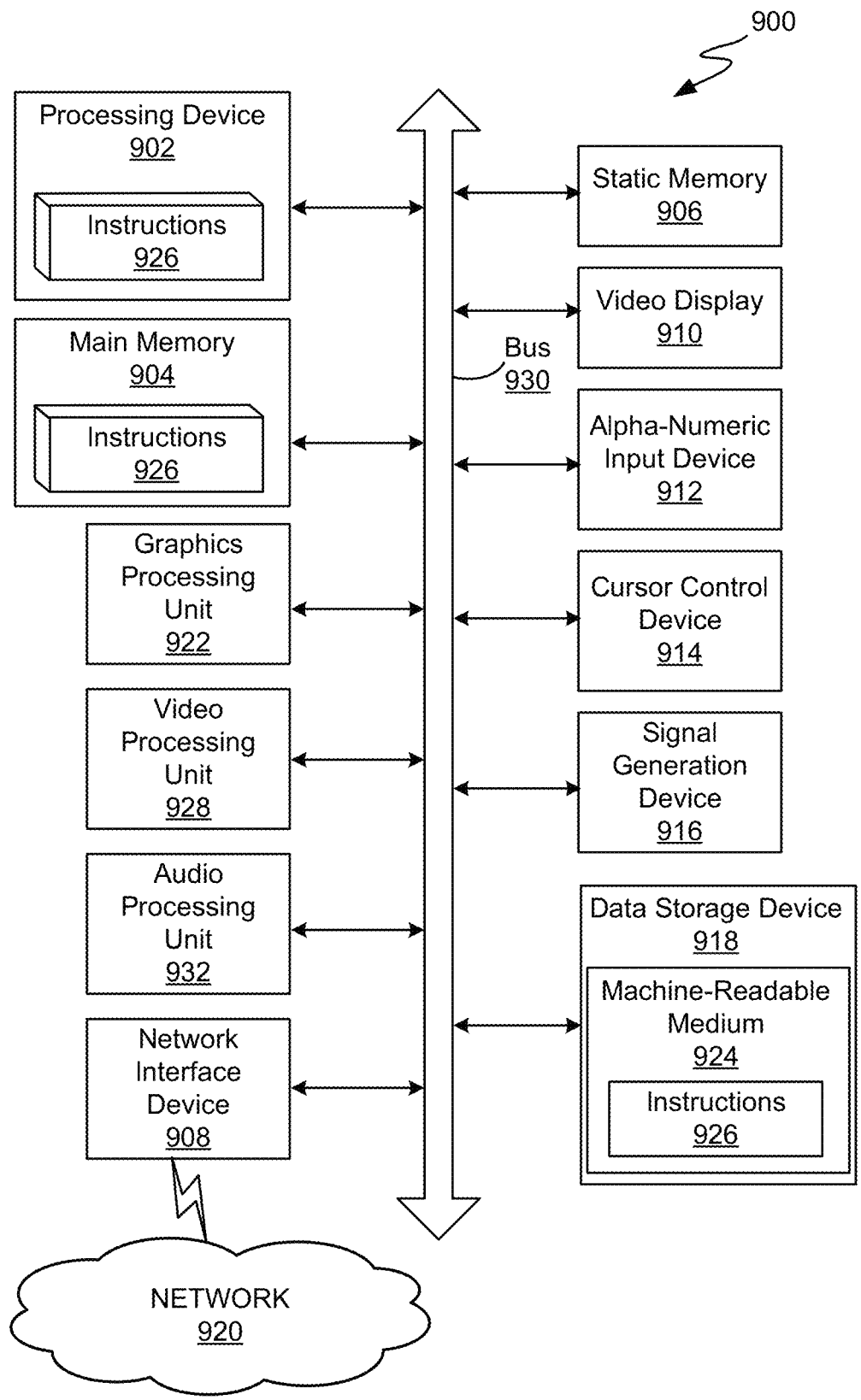
FIG. 4 depicts an example diagram of an example computer system in which embodiments of the present disclosure may operate.

FIG. 4 illustrates an example machine of a computer system 900 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 900 includes a processing device 902, a main memory 904 (e.g., read-only memory (ROM), flash memory, dynamic random access memory (DRAM) such as synchronous DRAM (SDRAM), a static memory 906 (e.g., flash memory, static random access memory (SRAM), etc.), and a data storage device 918, which communicate with each other via a bus 930.

Processing device 902 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 902 may also be one or more special-purpose processing devices such as an application specific integrated circuit (ASIC), a field programmable gate array (FPGA), a digital signal processor (DSP), network processor, or the like. The processing device 902 may be configured to execute instructions 926 for performing the operations and steps described herein.

The computer system 900 may further include a network interface device 908 to communicate over the network 920. The computer system 900 also may include a video display unit 910 (e.g., a liquid crystal display (LCD) or a cathode ray tube (CRT)), an alphanumeric input device 912 (e.g., a keyboard), a cursor control device 914 (e.g., a mouse), a graphics processing unit 922, a signal generation device 916 (e.g., a speaker), graphics processing unit 922, video processing unit 928, and audio processing unit 932.

The data storage device 918 may include a machine-readable storage medium 924 (also known as a non-transitory computer-readable medium) on which is stored one or more sets of instructions 926 or software embodying any one or more of the methodologies or functions described herein. The instructions 926 may also reside, completely or at least partially, within the main memory 904 and/or within the processing device 902 during execution thereof by the computer system 900, the main memory 904 and the processing device 902 also constituting machine-readable storage media.

In some implementations, the instructions 926 include instructions to implement functionality corresponding to the present disclosure. While the machine-readable storage medium 924 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 902 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMS, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

The above embodiments of the present disclosure are illustrative and not limitative. Embodiments of the present disclosure are not limited by the dimension(s) of the array or the number of transmitters/receivers disposed in each array. Embodiments of the present disclosure are not limited by the wavelength of the electromagnetic or optical source used in the array. Embodiments of the present invention are not limited to the circuitry, such as phase modulators, splitters, detectors, control unit, mixers, and the like, used in the transmitter or receiver arrays. Embodiments of the present disclosure are not limited by the number or shape of the PIC and/or EIC tiles. Other additions, subtractions or modifications are obvious in view of the present disclosure and are intended to fall within the scope of the appended claims.

What is claimed is:

1. A differential multiplexer comprising at least first and second input stages, each input stage comprising:
    a first transistor receiving an input signal;
    a second transistor receiving an inverse of the input signal;
    a biasing circuit adapted to bias a gate terminal of each of the first and second transistors;
    a first capacitor coupled to the biasing circuit and the gate terminal of the first transistor;
    a second capacitor coupled to the biasing circuit and the gate terminal of the second transistor;
    a first current source coupled between a source terminal of each of the first and second transistors and a ground terminal;
    a first switch adapted to couple a drain terminal of the first transistor to a first terminal of a first resistor in response to a select signal, wherein a second terminal of the first resistor is coupled to a supply voltage;
    a second switch adapted to couple a drain terminal of the second transistor to a first terminal of a second resistor in response to the select signal, wherein a second terminal of the second resistor is coupled to the supply voltage;
    a third switch adapted to couple the drain terminal of the first transistor to the supply voltage in response to an inverse of the select signal; and
    a fourth switch adapted to couple the drain terminal of the second transistor to the supply voltage in response to the inverse of the select signal.

2. The differential multiplexer of claim 1 wherein the biasing circuit comprises a bandgap circuit.

3. The differential multiplexer of claim 1 wherein the biasing circuit comprises:
    a third resistor coupled between the gate terminal of the first transistor and a first node; and
    a fourth resistor coupled between the gate terminal of the second transistor and the first node.

4. The differential multiplexer of claim 1 wherein the biasing circuit biases the gate terminals of the first and second transistors at nearly one half of a voltage swing of the input signal.

5. The differential multiplexer of claim 1 wherein the first current source is adapted to maintain the first transistor in a weak conductive state when the third switch is closed.

6. The differential multiplexer of claim 1 further comprising a common current source, wherein each input stage further comprises a fifth switch adapted to couple the first and second transistor disposed in the input stage to the common current source in response to the select signal.

7. The differential multiplexer of claim 1 wherein each of the first and second transistors of each stage is an n-channel MOS transistor.

8. The differential multiplexer of claim 3 wherein each of the first and second resistors has a first resistance, and wherein each of the third and fourth resistors has a second resistance greater than the first resistance.

9. A system comprising:
    a memory storing instructions; and
    a processor, coupled with the memory and to execute the instructions, the instructions when executed cause the processor to generate data representative of a differential multiplexer comprising at least first and second input stages, each input stage comprising:
    a first transistor receiving an input signal;
    a second transistor receiving an inverse of the input signal;
    a biasing circuit adapted to bias a gate terminal of each of the first and second transistors;
    a first capacitor coupled to the biasing circuit and the gate terminal of the first transistor;
    a second capacitor coupled to the biasing circuit and the gate terminal of the second transistor;
    a first current source coupled between a source terminal of each of the first and second transistors and a ground terminal;
    a first switch adapted to couple a drain terminal of the first transistor to a first terminal of a first resistor in response to a select signal, wherein a second terminal of the first resistor is coupled to a supply voltage;
    a second switch adapted to couple a drain terminal of the second transistor to a first terminal of a second resistor in response to the select signal, wherein a second terminal of the second resistor is coupled to the supply voltage;
    a third switch adapted to couple the drain terminal of the first transistor to the supply voltage in response to an inverse of the select signal; and
    a fourth switch adapted to couple the drain terminal of the second transistor to the supply voltage in response to the inverse of the select signal.

10. The system of claim 9 wherein the biasing circuit comprises a bandgap circuit.

11. The system of claim 9 wherein the biasing circuit comprises:
    a third resistor coupled between the gate terminal of the first transistor and a first node; and
    a fourth resistor coupled between the gate terminal of the second transistor and the first node.

12. The system of claim 9 wherein the biasing circuit biases the gate terminals of the first and second transistors at nearly one half of a voltage swing of the input signal.

13. The system of claim 9 wherein the first current source is adapted to maintain the first transistor in a weak conductive state when the third switch is closed.

14. The system of claim 9 further comprising a common current source, wherein each input stage further comprises a fifth switch adapted to couple the first and second transistor disposed in the input stage to the common current source in response to the select signal.

15. The system of claim 9 wherein each of the first and second transistors of each stage is an n-channel MOS transistor.

16. The system of claim 11 wherein each of the first and second resistors has a first resistance, and wherein each of third and fourth resistors has a second resistance greater than the first resistance.

17. A non-transitory computer readable medium comprising stored instructions, which when executed by a processor, cause the processor to generate data representative of a differential multiplexer, the differential multiplexer comprising:
- a first transistor receiving an input signal;
- a second transistor receiving an inverse of the input signal;
- a biasing circuit adapted to bias a gate terminal of each of the first and second transistors;
- a first capacitor coupled to the biasing circuit and the gate terminal of the first transistor;
- a second capacitor coupled to the biasing circuit and the gate terminal of the second transistor;
- a first current source coupled between a source terminal of each of the first and second transistors and a ground terminal;
- a first switch adapted to couple a drain terminal of the first transistor to a first terminal of a first resistor in response to a select signal, wherein a second terminal of the first resistor is coupled to a supply voltage;
- a second switch adapted to couple a drain terminal of the second transistor to a first terminal of a second resistor in response to the select signal, wherein a second terminal of the second resistor is coupled to the supply voltage;
- a third switch adapted to couple the drain terminal of the first transistor to the supply voltage in response to an inverse of the select signal; and
- a fourth switch adapted to couple the drain terminal of the second transistor to the supply voltage in response to the inverse of the select signal.

18. The non-transitory computer readable medium of claim 17 wherein the biasing circuit comprises a bandgap circuit.

19. The non-transitory computer readable medium of claim 17 wherein the biasing circuit comprises:
- a third resistor coupled between the gate terminal of the first transistor and a first node; and
- a fourth resistor coupled between the gate terminal of the second transistor and the first node.

20. The non-transitory computer readable medium of claim 17 wherein the biasing circuit biases the gate terminals of the first and second transistors at nearly one half of a voltage swing of the input signal.

* * * * *